United States Patent
Takakusaki et al.

(10) Patent No.: US 7,936,569 B2
(45) Date of Patent: May 3, 2011

(54) CIRCUIT DEVICE AND METHOD OF MANUFACTURING THE SAME

(75) Inventors: Sadamichi Takakusaki, Ota (JP); Noriaki Sakamoto, Yamada-gun (JP); Motoichi Nezu, Ora-gun (JP); Yusuke Igarashi, Isesake (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 278 days.

(21) Appl. No.: 11/307,283

(22) Filed: Jan. 30, 2006

(65) Prior Publication Data

US 2007/0205017 A1   Sep. 6, 2007

(30) Foreign Application Priority Data

Jan. 31, 2005 (JP) ................................. 2005-023328
Nov. 30, 2005 (JP) ................................. 2005-346916

(51) Int. Cl.
*H05K 7/00* (2006.01)
(52) U.S. Cl. ..... 361/777; 361/705; 361/779; 361/306.3; 29/846; 29/832; 257/621; 257/706; 257/778; 257/780; 438/209; 438/612; 438/615; 438/720
(58) Field of Classification Search .................. 361/777, 361/705, 779, 306.32, 306.3; 29/846, 606, 29/832; 257/621, 780, 706, 778; 438/209, 438/612, 615, 720
See application file for complete search history.

(56) References Cited

U.S. PATENT DOCUMENTS

| | | | | |
|---|---|---|---|---|
| 3,793,161 A | * | 2/1974 | Manko | 205/252 |
| 4,412,377 A | * | 11/1983 | Nagashima et al. | 29/832 |
| 4,631,571 A | * | 12/1986 | Tsubokura | 257/203 |
| 5,121,871 A | * | 6/1992 | Beavis et al. | 228/123.1 |
| 5,122,200 A | * | 6/1992 | Davis et al. | 148/23 |
| 5,726,501 A | * | 3/1998 | Matsubara | 257/778 |
| 5,895,973 A | * | 4/1999 | Fessenden | 257/713 |
| 5,973,932 A | * | 10/1999 | Nguyen | 361/779 |
| 6,189,203 B1 | * | 2/2001 | Heinrich et al. | 29/606 |
| 6,197,434 B1 | * | 3/2001 | Hsu | 428/615 |
| 6,333,989 B1 | * | 12/2001 | Borza | 382/124 |

(Continued)

FOREIGN PATENT DOCUMENTS

JP   05-206620   8/1993

(Continued)

OTHER PUBLICATIONS

Korean Office Action, dated Dec. 11, 2007.

(Continued)

*Primary Examiner* — Xiaoliang Chen
(74) *Attorney, Agent, or Firm* — Westerman, Hattori, Daniels & Adrian, LLP

(57) ABSTRACT

In a hybrid integrated circuit device that is a circuit device of the present invention, a conductive pattern including pads is formed on a surface of a substrate. A first pad is formed to be relatively large since a heat sink is mounted thereon. A second pad is a small pad to which a chip component or a small signal transistor is fixed. In the present invention, a plated film made of nickel is formed on a surface of the first pad. Therefore, the first pad and a solder never come into contact with each other. Thus, a Cu/Sn alloy layer having poor soldering properties is not generated but a Ni/Sn alloy layer having excellent soldering properties is generated. Consequently, occurrence of sink in the melted solder is suppressed.

10 Claims, 13 Drawing Sheets

U.S. PATENT DOCUMENTS

| | | | |
|---|---|---|---|
| 6,416,590 B1* | 7/2002 | Hirata et al. | 148/24 |
| 6,444,562 B1* | 9/2002 | Chalco et al. | 438/613 |
| 6,448,644 B1* | 9/2002 | Lin | 257/734 |
| 6,543,674 B2* | 4/2003 | Lee et al. | 228/180.22 |
| 6,614,641 B2* | 9/2003 | Kayatani et al. | 361/305 |
| 6,653,219 B2* | 11/2003 | Fukuyama | 438/616 |
| 6,673,310 B2* | 1/2004 | Tadauchi et al. | 420/557 |
| 6,695,200 B2* | 2/2004 | Suzuki et al. | 228/180.22 |
| 6,706,329 B1* | 3/2004 | Chien | 427/406 |
| 6,773,956 B2* | 8/2004 | Huebner et al. | 438/106 |
| 6,798,050 B1* | 9/2004 | Homma et al. | 257/678 |
| 6,841,862 B2* | 1/2005 | Kikuchi et al. | 257/680 |
| 6,861,370 B1* | 3/2005 | Kasatani | 438/745 |
| 6,881,278 B2* | 4/2005 | Amita et al. | 148/23 |
| 6,940,169 B2* | 9/2005 | Jin et al. | 257/738 |
| 6,979,600 B2* | 12/2005 | Brandenburger | 438/127 |
| 7,119,432 B2* | 10/2006 | Desai et al. | 257/706 |
| 7,168,608 B2* | 1/2007 | Mei | 228/254 |
| 7,169,627 B2* | 1/2007 | Duh et al. | 438/16 |
| 7,256,115 B2* | 8/2007 | Farnworth et al. | 438/612 |
| 7,282,174 B2* | 10/2007 | Hirata et al. | 420/562 |
| 7,282,175 B2* | 10/2007 | Amagai et al. | 420/562 |
| 7,296,347 B2* | 11/2007 | Antaya et al. | 29/874 |
| 7,323,778 B2* | 1/2008 | Shizuno | 257/735 |
| 7,325,716 B2* | 2/2008 | Debelius et al. | 228/180.22 |
| 2001/0050429 A1* | 12/2001 | Ashdown | 257/706 |
| 2002/0033204 A1* | 3/2002 | Saita et al. | 148/23 |
| 2002/0041022 A1* | 4/2002 | Sakamoto et al. | 257/701 |
| 2003/0024606 A1* | 2/2003 | Hayakawa et al. | 148/307 |
| 2003/0193094 A1* | 10/2003 | Takahashi et al. | 257/780 |
| 2003/0219966 A1* | 11/2003 | Jin et al. | 438/612 |
| 2004/0188814 A1* | 9/2004 | Houle et al. | 257/678 |
| 2006/0024943 A1* | 2/2006 | Kang et al. | 438/612 |
| 2006/0147683 A1* | 7/2006 | Ikeda et al. | 428/209 |

FOREIGN PATENT DOCUMENTS

| | | |
|---|---|---|
| JP | 2002-134682 | 5/2002 |
| JP | 2003-309223 | 10/2003 |
| JP | 2005-095977 | 4/2005 |
| KR | 2003-0082382 | 10/2003 |
| KR | 10-0629826 | 9/2006 |

OTHER PUBLICATIONS

Chinese Office Action, dated Oct. 19, 2007.

* cited by examiner

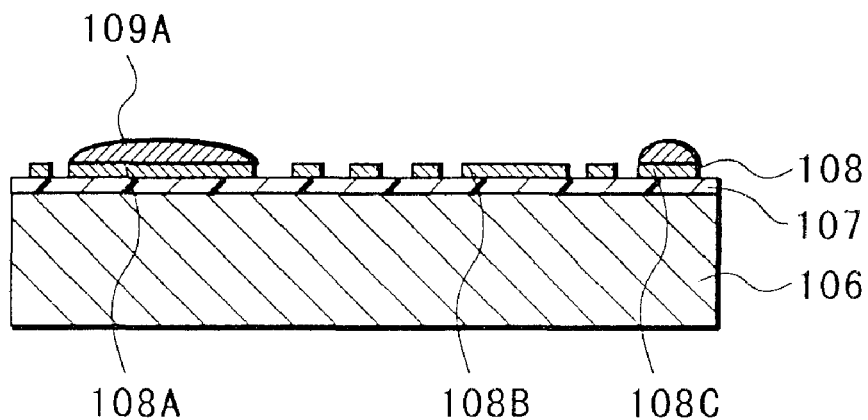
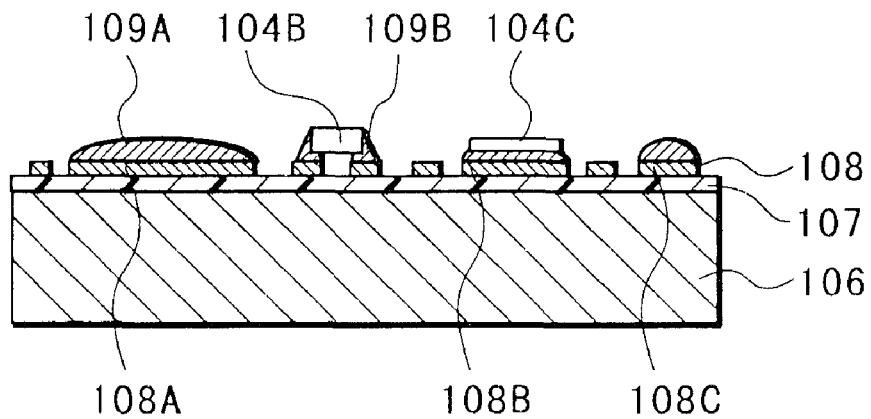
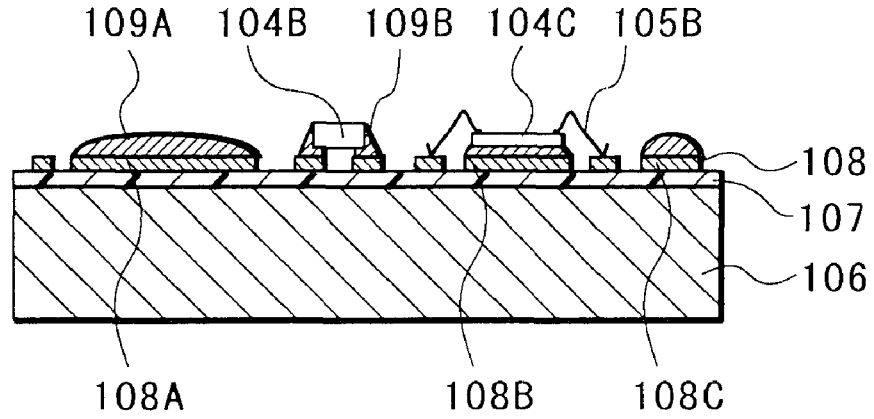

US 7,936,569 B2

CIRCUIT DEVICE AND METHOD OF MANUFACTURING THE SAME

CROSS-REFERENCE TO RELATED APPLICATIONS

Priority is claimed to Japanese Patent Application Numbers JP2005-023328, filed on Jan. 31, 2005, and JP2005-346916, filed on Nov. 30, 2005, the disclosures of which are incorporated herein by reference in its entireties.

BACKGROUND OF THE INVENTION

1. Field of the Invention

The present invention relates to a circuit device and a method of manufacturing the same, and more particularly relates to a circuit device in which large circuit elements are connected with solder and a method of manufacturing the same.

2. Description of the Related Art

With reference to FIGS. 10A to 11B, a method of manufacturing a conventional circuit device will be explained. Here, description will be given of a method of manufacturing a hybrid integrated circuit device in which a conductive pattern 108 and circuit elements are formed on a surface of a substrate 106. This technology is described for instance in Japanese Patent Application Publication No. 2002-134682.

As shown in FIG. 10A, first, a solder 109A is formed on a surface of the conductive pattern 108 formed on the surface of the substrate 106. The substrate 106 is, for example, a metal substrate made of metal such as aluminum. The conductive pattern 108 and the substrate 106 are insulated from each other by an insulating layer 107. The conductive pattern 108 forms pads 108A, 108B and 108C. A heat sink is fixed to an upper part of the pad 108A in a subsequent step. A small signal transistor is fixed to the pad 108B in a subsequent step. A lead is fixed to the pad 108C in a subsequent step. Here, the solder 109A is formed on each of surfaces of the pad 108A, which is a relatively large pad, and the pad 108C.

As shown in FIG. 10B, next, a small signal transistor 104C and a chip component 104B are fixed by use of a solder 109B. In this step, heating is performed until the solder 109B, which connects the transistor 104C and the like, is melted. Therefore, the solder 109A formed on each of the pads 108A and 108C in the preceding step is also melted.

As shown in FIG. 10C, next, the small signal transistor 104C and a predetermined conductive pattern 108 are connected to each other by use of a thin wire 105B.

As shown in FIG. 11A, next, the solder 109A previously formed on each of the pads 108A and 108C is melted to fix a heat sink 111 and a lead 101. Here, the heat sink 111 having a power transistor 104A mounted thereon is fixed onto the pad 108A with the previously formed solder 109A interposed therebetween. Furthermore, a desired conductive pattern 108 and the transistor 104A are connected to each other by use of a thick wire 105A.

As shown in FIG. 11B, a sealing resin 102 is formed so as to cover the circuit elements and the conductive pattern 108 which are formed on the surface of the substrate 106. By the above steps, a hybrid integrated circuit device 100 is manufactured.

However, as shown in FIGS. 12A to 13B, in a step of fixing the chip component 104B and the like by heating and melting the solder 109B, there is a problem of sink in the solder 109A. FIG. 12A is a plan view of the substrate 106 in which sink occurs. FIG. 12B is a cross-sectional view of FIG. 12A. FIG. 12C is an enlarged cross-sectional view of a portion where the sink occurs. Moreover, FIGS. 13A and 13B are views showing in detail the boundary between the solder 109A and the pad 108A.

As shown in FIGS. 12A and 12B, "sink" means a phenomenon that the solder 109A formed on the entire surface of the pad 108A is accumulated on one side or the other. Particularly, the pad 108A on which the heat sink 111 is fixed is formed to have a large rectangular shape with a length of 9 mm or more on a side, for example. Therefore, compared with other portions, a large amount of solder is attached to the upper part of the pad 108A. Accordingly, a large surface tension acts on the melted solder 109A. Thus, sink of the solder occurs.

Particularly, the sink of the solder 109A frequently occurs in the step of fixing the chip component 104B by use of the solder 109B. Specifically, in this step, solder paste applied to the small pad 108B is heated and melted to fix the chip component 104B and the like. By the heating and melting in this step, the solder 109A previously formed on the surface of the relatively large pad 108A is also remelted. Since the remelted solder 109A includes no flux unlike the solder paste, a large surface tension acts thereon. Therefore, sink occurs in the remelted solder 109A.

As shown in FIG. 12C, generation of an alloy layer 110 between the pad 108A and the solder 109A is one of the causes of the occurrence of the sink. When the solder paste is attached to the upper part of the pad 108A and heated and melted, an intermetallic compound is formed, which is made of copper that is a material of the pad 108A and tin that is a material of the solder. In FIG. 12C, a layer made of the intermetallic compound is indicated by the alloy layer 110. To be more specific, a thickness of the alloy layer 110 is about several μm, and an intermetallic compound having a composition of $Cu_6Sn_5$ or $Cu_3Sn$ is formed. This alloy layer 110 has poor solder wettability compared with copper that is the material of the pad 108A. Accordingly, formation of the alloy layer 110 having the poor solder wettability causes the sink of the solder. In the below description, the alloy layer made of copper and tin is called a Cu/Sn alloy layer.

Furthermore, activation of an interface between the alloy layer 110 and the solder 109A by melting of the alloy made of copper and tin into the solder 109A is also one of the causes of the occurrence of the sink described above.

FIG. 13A is a cross-sectional view of the substrate 106 in which the above-described sink occurs. FIG. 13B is a SEM (scanning electron microscopy) image of a cross section of the boundary between the pad 108A and the solder 109A.

As shown in FIG. 13B, on the boundary between the pad 108A and the solder 109A, the alloy layer 110 made of copper and tin is generated. As described above, since the solder 109A is melted more than once, formation of the alloy layer 110 which is as thick as about 5 μm or more, for example, induces sink. Moreover, the intermetallic compound made of copper and tin is formed at a high rate. Thus, activation of the boundary between the solder 109A and the pad 108A is also the cause of occurrence of the sink. Furthermore, the intermetallic compound is formed not only in the boundary therebetween but also in the solder 109A, for example.

Furthermore, although not clearly shown in the SEM image, a number of hemispherical protrusions, each of which has a size of about 5 to 10 μm, for example, and is made of the intermetallic compound, are formed on the entire upper surface of the alloy layer 110. The alloy layer 110 has a relatively smooth surface. The formation of the protrusions reduces an interface resistance on the upper surface of the alloy layer 110 and leads to a situation where the solder 109A is likely to slip on the surface. Thus, occurrence of the sink described above is promoted.

Meanwhile, in consideration of the environments, lead-free solder has recently been used. If the lead-free solder is used as the solder 109A, the problem of the sink described above occurs more prominently. This is because the lead-free solder contains more tin than lead eutectic solder does. To be more specific, a proportion of tin contained in a general lead eutectic solder is about 60 wt %. On the other hand, a proportion of tin contained in the lead-free solder is about 90 wt %, which is relatively large. Furthermore, when the lead-free solder is melted, a temperature is higher than that on the occasion when the lead eutectic solder is melted. This is also the cause of formation of the thick alloy layer 110. To be more specific, when the lead eutectic solder is melted, the temperature is about 200° C. Meanwhile, when a lead-free solder having a composition of Sn-3.0Ag-0.5Cu, for example, is melted, the temperature is about 240° C. As described above, the higher the melting temperature is, the more the chemical reaction is accelerated. Thus, the alloy layer 110 having poor wettability is formed to be thicker.

When the sink of the solder 109A occurs, the pad 108A and the circuit element are not connected to each other in the portion where the sink occurs. Therefore, thermal resistance in the portion where the sink occurs is increased. Furthermore, strength of a solder connection part is lowered by the occurrence of the sink. Thus, connection reliability of the solder connection part with respect to a change in temperature is lowered.

SUMMARY OF THE INVENTION

The present invention has been made in consideration for the foregoing problems. The present invention provides a circuit device which suppresses occurrence of sink of solder and improves connection reliability of a solder connection part and the present invention provides a manufacturing method thereof.

A circuit device of the present invention includes: a substrate on which a conductive pattern including a pad is formed; and a circuit element fixed to the pad with solder interposed therebetween. The solder is attached to a plated film formed on a surface of the pad.

A method of manufacturing a circuit device of the present invention includes: forming a conductive pattern on a surface of a substrate, the conductive pattern including a pad covered with a plated film; applying solder paste to a surface of the plated film; and heating and melting the solder paste to fix a circuit element to the pad by use of solder which comes into contact with the plated film.

Furthermore, a method of manufacturing a circuit device of the present invention includes: forming a conductive pattern on a surface of a substrate, the conductive pattern including a first pad covered with a plated film and a second pad smaller than the first pad; applying solder paste to the plated film formed on the first pad and heating and melting the solder paste to form solder on a surface of the plated film; fixing a circuit element to the second pad; and fixing a circuit element to the first pad by remelting the solder formed on the plated film which covers the first pad.

BRIEF DESCRIPTION OF THE DRAWINGS

FIGS. 10A to 10C are cross-sectional views showing a conventional method of manufacturing a circuit device.

DESCRIPTION OF THE EMBODIMENTS

First Embodiment

Figure 1A:
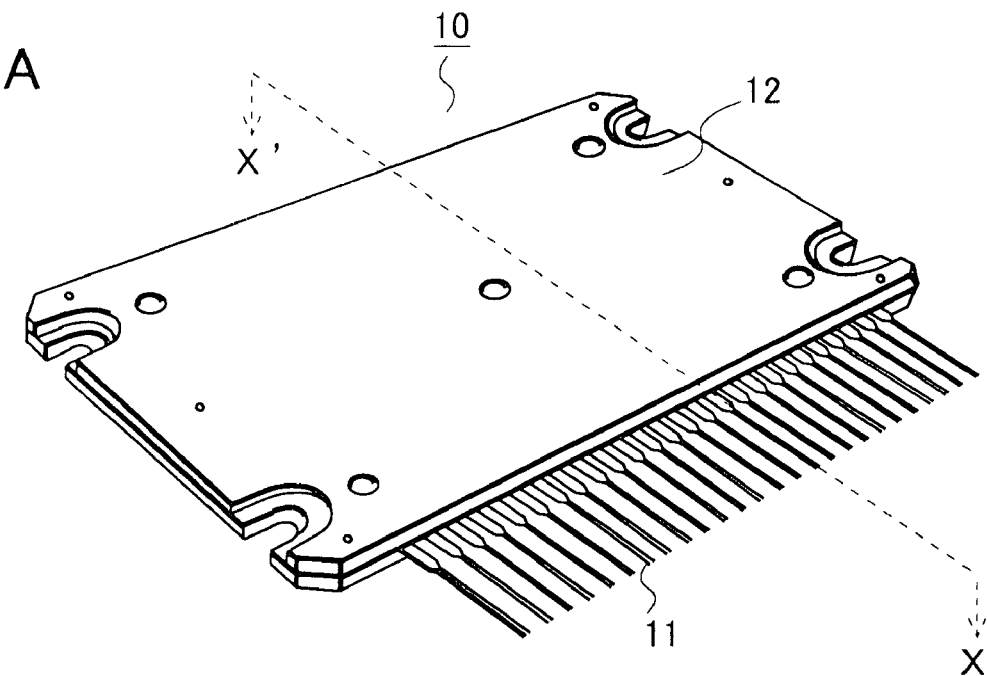
FIG. 1A is a perspective view and FIGS. 1B and 1C are cross-sectional views which show a circuit device of a first embodiment of the present invention.

In this embodiment, with reference to FIGS. 1A to 1C, description will be given of a configuration of a hybrid integrated circuit device 10 that is a circuit device of the present invention. FIG. 1A is a perspective view of the hybrid integrated circuit device 10, FIG. 1B is a cross-sectional view thereof, and FIG. 1C is a cross-sectional view showing a heat sink 14D fixed to a pad 18A.

Figure 1B:
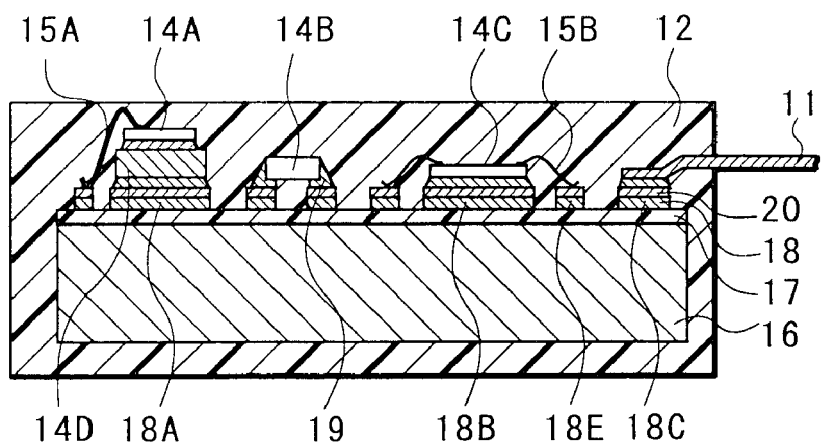
Figure 1C:
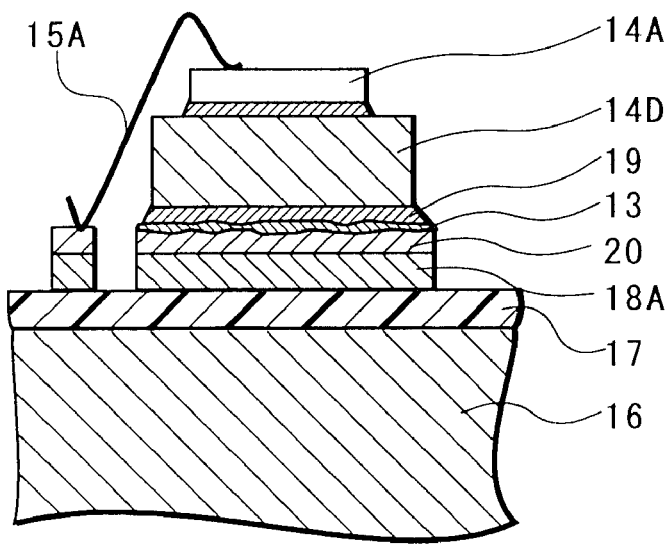

As shown in FIGS. 1A and 1B, in the hybrid integrated circuit device 10, a conductive pattern 18 is formed on a surface of a substrate 16, and a circuit element such as a transistor is fixed to the conductive pattern 18 with a solder 19 interposed therebetween. Moreover, at least the surface of the substrate 16 is covered with a sealing resin 12.

As the substrate 16, a metal substrate mainly made of aluminum, copper or the like, a substrate made of a resin material such as an epoxy resin, a substrate made of a flexible sheet, for example, a printed board, or the like is used. Moreover, a ceramic substrate made of alumina and the like, a glass substrate and the like can also be adopted as the substrate 16. If a substrate made of aluminum is adopted as the substrate 16, a surface of the substrate 16 is subjected to alumite treatment. A specific size of the substrate 16 is, for example, about length×breadth×thickness=60 mm×40 mm×1.5 mm.

An insulating layer 17 is formed so as to cover the entire surface of the substrate 16. The insulating layer 17 is made of an epoxy resin or the like, which is filled with a large amount of fillers such as $Al_2O_3$. Thus, heat generated from the circuit element included in the device can be actively discharged to the outside through the substrate 16. A specific thickness of the insulating layer 17 is, for example, about 50 μm.

The conductive pattern 18 is formed of metal mainly made of copper and is formed on a surface of the insulating layer 17 so as to realize a predetermined electric circuit. Moreover, the conductive pattern 18 forms pads 18A to 18C. The respective pads will be described in detail later with reference to FIGS. 3A and 3B.

A plated film 20 is formed so as to cover surfaces of the pads 18A to 18C formed of the conductive pattern 18. A thickness of the plated film 20 is, for example, about 3 μm. As a material of the plated film 20, nickel is preferable. When solder is attached to a surface of the plated film 20 made of nickel, an intermetallic compound is generated, which is made of tin contained in the solder and of nickel. The intermetallic compound made of tin and nickel has solder wettability better than that of the above-described intermetallic compound made of tin and copper. Therefore, in the manufacturing steps, occurrence of sink due to generation of the intermetallic compound including tin contained in the solder is suppressed.

The plated film 20 may be formed only on the large pad 18A, which has a risk of occurrence of sink, or may be formed on all the pads. Furthermore, the plated film 20 is also formed on an upper surface of a bonding pad 18E in order to facilitate formation of a thin metal wire.

In this embodiment, the plated film 20 is preferably formed by use of an electroplating method. As a method of forming the plated film, there are the electroplating method and an electroless plating method. The plated film 20 can be formed by use of either method. However, if the plated film 20 is formed by the electroless plating method, phosphorus (P) used as a catalyst is mixed into the plated film 20. Thus, phosphorus is also mixed into an alloy layer 13 formed on an interface between the plated film 20 and the solder 19. In the alloy layer 13 containing phosphorus, its mechanical strength is lowered. Thus, when stress acts on the alloy layer 13 in use, there arises a problem that the alloy layer 13 is easily separated from the plated film 20. On the other hand, in the electroplating method, since no phosphorus is used, no phosphorus is mixed into the plated film 20 to be formed. Thus, the plated film 20 having excellent mechanical strength can be formed.

Circuit elements such as a power transistor 14A, a chip component 14B and a small signal transistor 14C are fixed to the predetermined conductive patterns 18 with the solder 19 interposed therebetween. The power transistor 14A is fixed to the pad 18A with the heat sink 14D interposed therebetween. Thus, heat release properties are improved. The chip component 14B has electrodes on its both ends, which are fixed to the conductive pattern 18 by use of the solder 19. The small signal transistor 14C is fixed to the pas 18B with the solder 19 interposed therebetween. Here, the power transistor 14A is, for example, a transistor through which a current of 1A or more flows. The small signal transistor 14C is a transistor through which a current of less than 1A flows. Furthermore, an electrode on a surface of the power transistor 14A is connected to the conductive pattern 18 through a thick wire 15A that is a thin metal wire having a thickness of 100 μm or more. Moreover, an electrode formed on a surface of the small signal transistor 14C is connected to the conductive pattern 18 through a thin wire 15B having a thickness of about 80 μm or less.

As circuit elements mounted on the substrate 16, semiconductor elements such as a transistor, an LSI chip and a diode can be adopted. Moreover, chip components such as a chip resistor, a chip condenser, an inductance, a thermistor, an antenna and an oscillator can also be adopted as the circuit elements. Furthermore, a circuit device of a plastic molding type can also be included in the hybrid integrated circuit device 10.

A lead 11 is fixed to the pad 18C provided in a peripheral part of the substrate 16 and has a function of performing input and output from and to the outside. Here, a number of leads 11 are fixed to one side of the substrate 16. Note that the leads 11 can also be derived from four sides of the substrate 16 or can also be derived from two opposite sides thereof.

The sealing resin 12 is formed by transfer molding using a thermosetting resin. As shown in FIG. 1B, the conductive pattern 18 and the circuit elements, which are formed on the surface of the substrate 16, are covered with the sealing resin 12. Here, sides and a rear surface of the substrate 16 are also covered with the sealing resin 12. By covering the entire substrate 16 with the sealing resin 12 as described above, moisture resistance of the entire device can be improved. Moreover, in order to improve heat release properties of the substrate 16, the rear surface of the substrate 16 may be exposed from the sealing resin 12. Furthermore, instead of covering with the sealing resin 12, sealing by use of a case material can also be performed.

As shown in FIG. 1C, on the boundary between the plated film 20 formed on the upper surface of the pad 18A and the solder 19 attached thereabove, the alloy layer 13 is formed. As described above, the alloy layer 13 is a layer formed of the intermetallic compound made of tin that is a major component of the solder 19 and nickel that is a material of the plated film 20 (in the following description, the alloy layer made of nickel and tin is called a Ni/Sn layer). A thickness of the alloy layer 13 is, for example, about 0.1 μm to 5 μm. The alloy layer 13 of this embodiment, which is made of nickel and tin, has excellent solder wettability compared to alloy made of copper and tin. In this embodiment, sink of the solder in the middle of the manufacturing steps is suppressed by formation of the alloy layer 13 having excellent solder wettability as described above.

Figure 2:
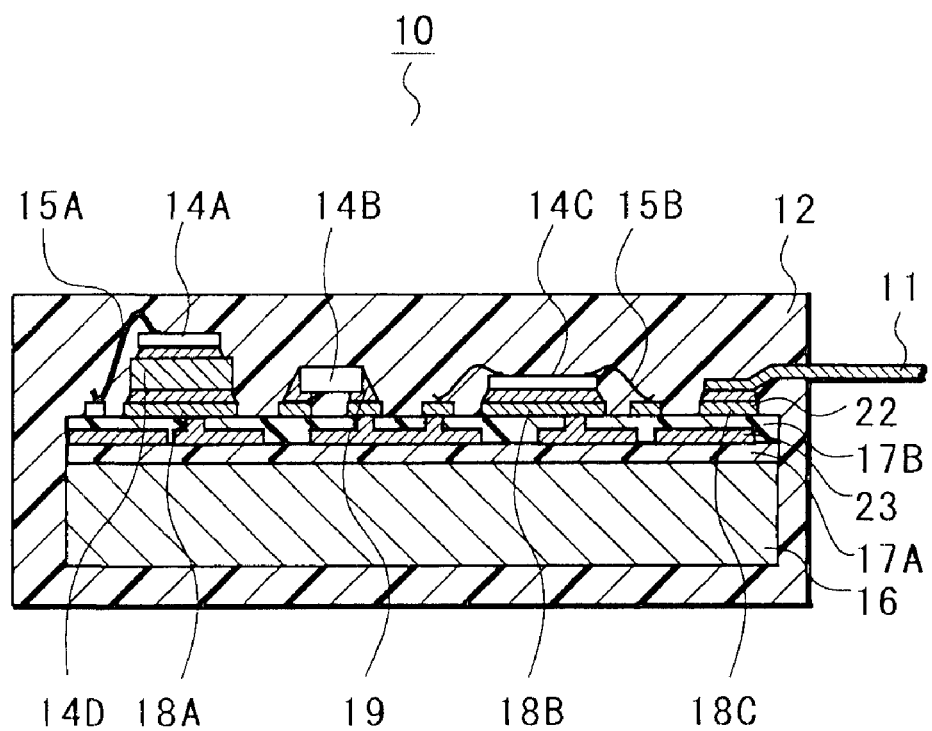
FIG. 2 is a cross-sectional view showing a circuit device of an embodiment of the present invention.

With reference to a cross-sectional view of FIG. 2, description will be given of a structure of a hybrid integrated circuit device 10 of another embodiment. Here, a two-layer conductive pattern including a first wiring layer 22 and a second wiring layer 23 is formed on a surface of a substrate 16. The surface of the substrate 16 is covered with a lower insulating layer 17A, and the second wiring layer 23 is formed on a surface of the insulating layer 17A. Furthermore, the second wiring layer 23 is covered with an upper insulating layer 17B, and the first wiring layer 22 is formed on a surface of the insulating layer 17B. The first and second wiring layers 22 and 23 are connected to each other in predetermined spots through the insulating layer 17B. Here, a pad 18A and the like are formed of the first wiring layer 22. Although FIG. 2 shows a two-layer wiring structure, a multilayer wiring structure including three layers or more may be formed. By forming the multilayer wiring structure as described above, a more complex and multifunctional electric circuit can be included in the hybrid integrated circuit device 10.

In this embodiment, by covering the surfaces of the pad 18A and the like with a plated film 20, it is possible to prevent destruction of a connection part connected by solder 19. To be more specific, since the surfaces of the pad 18A and the like are covered with the plated film 20 made of nickel, the pad 18A made of copper does not come into direct contact with the solder 19. Therefore, a fragile intermetallic compound, which is made of tin contained in the solder and copper that is a material of the pad 18A, is never generated. Moreover, even if the circuit element such as a transistor 14A generates heat and the pad 18A and the solder 19 are heated, it is less problematic that the intermetallic compound described above further grows. By covering the surface of the pad 18A with the plated film 20, an alloy layer 13 made of nickel and tin is formed on the boundary between the plated film 20 and the solder 19. The alloy layer 13 has mechanical strength better than that of the intermetallic compound made of tin and copper. Therefore, even if, in use, the transistor 14A and the like are operated to heat up the solder 19 and the alloy layer 13 grows, the connection part between the solder 19 and the plated film 20 is never easily destroyed.

Second Embodiment

In this embodiment, with reference to FIGS. 3 to 8, description will be given of a method of manufacturing the hybrid integrated circuit device 10 described above.

First Step: See FIGS. 3A and 3B

Figure 3A:
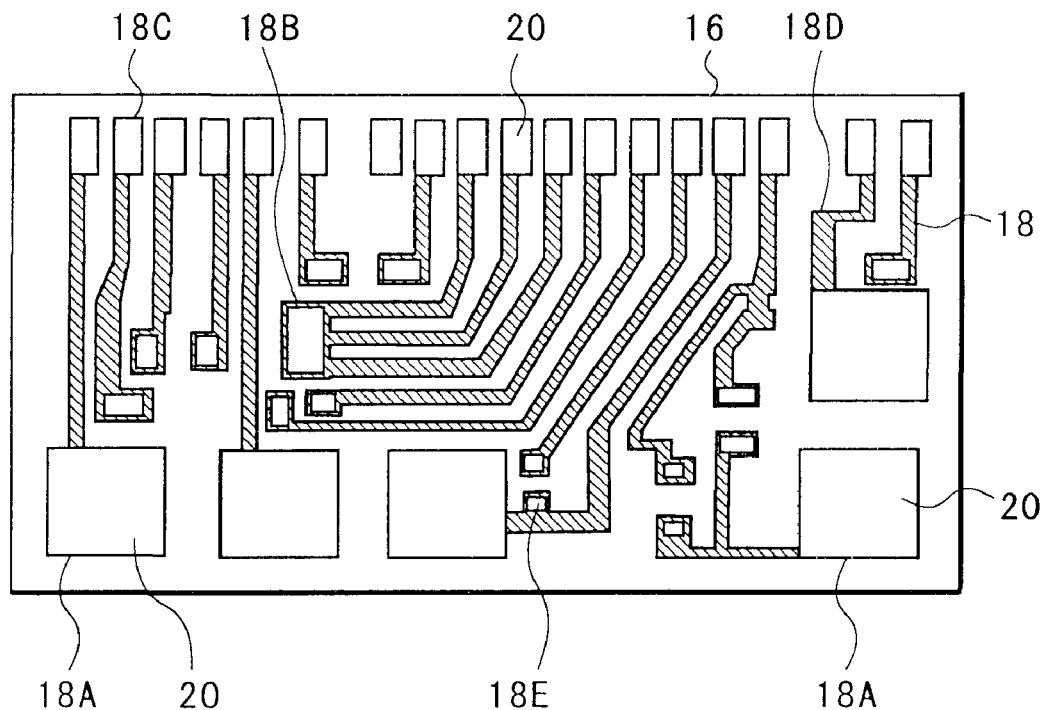
FIG. 3A is a plan view and FIG. 3B is a cross-sectional view which show a method of manufacturing a circuit device of a second embodiment of the present invention.

In this step, a conductive pattern 18 is formed on a surface of a substrate 16. FIG. 3A is a plan view of the substrate 16 in this step, and FIG. 3B is a cross-sectional view thereof.

Figure 3B:
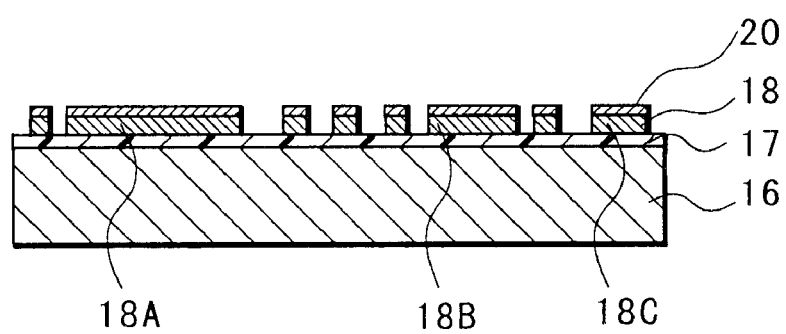

As shown in FIGS. 3A and 3B, by patterning a conductive foil attached to the surface of the substrate 16, the conductive pattern 18 having a predetermined pattern shape is formed. Here, the conductive pattern 18 forms pads 18A to 18C. The pad 18A is a pad to which a heat sink is fixed in a subsequent step, and is formed to be relatively large. For example, the pad 18A is formed in a rectangular shape having a size of 9 mm×9 mm or more. The pad 18B is a pad to which a small signal transistor or a chip component is fixed, and is formed to be smaller than the pad 18A. For example, the pad 18B is formed in a rectangular shape having a size of about 2 mm×2 mm. A plurality of the pads 18C are formed at even intervals along an upper side of the substrate 16 on the page space. A lead 11 is fixed to each of the pads 18C in a subsequent step. Furthermore, a wiring pattern 18D extended so as to connect the respective pads is also formed.

Moreover, surfaces of the pads 18A to 18C are covered with a plated film 20 made of nickel. Furthermore, a surface of a bonding pad 18E is also covered with a plated film made of nickel. Thus, bonding properties are improved. By forming the plated film 20 on the surfaces of the pad 18A and the like, sink of a solder formed on the pad 18A can be suppressed. This matter will be described in detail below.

Second Step: See FIGS. 4A to 4D

In this step, a solder 19A is formed on upper surfaces of the pads 18A and 18C.

Figure 4A:
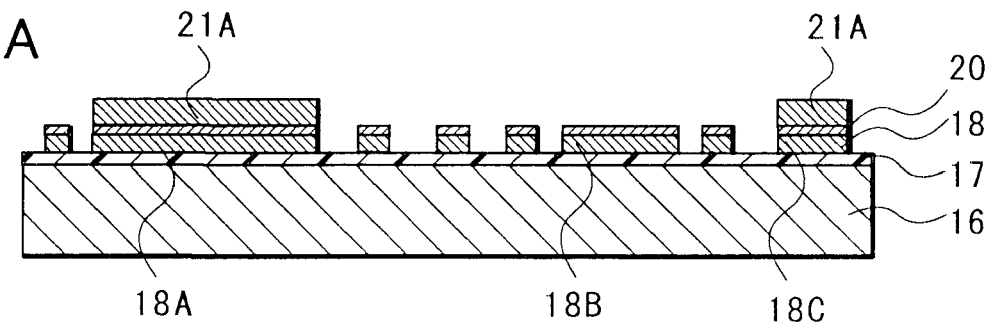
FIG. 4A is a cross-sectional view.

First, as shown in FIG. 4A, screen printing is performed to apply solder paste 21A to the upper surfaces of the pads 18A and 18C. In this step, the solder paste 21A is applied to a relatively large pad or a pad using more solder. Since the heat sink is fixed to the pad 18A in the subsequent step, the pad 18A is formed to have a rectangular shape with a length of 9 mm or more on a side as described above. Moreover, since a lead frame is fixed to the pad 18C in the subsequent step, a large amount of the solder paste 21A is applied thereto.

It is preferable that the solder paste 21A used in this step be a mixture of flux containing sulfur and solder powder. Sulfur is mixed in a proportion of 20 to 80 PPM into the flux. By mixing sulfur into the flux within such a concentration range, surface tension of the flux is reduced. Thus, wettability of the solder paste 21A can be improved. If the amount of sulfur is 20 PPM or less, the effect of improving the wettability is not sufficient. Consequently, there is a risk of occurrence of sink. Furthermore, if the amount of sulfur is 80 PPM or more, a nucleus of mixed sulfur remains in the solder. Thus, there is a risk that a local depression might be formed in the surface of the solder.

As a method of manufacturing the solder paste 21A, first, granular sulfur (S) is dissolved in a solvent. Next, after the solvent containing sulfur and flux are mixed, the flux and solder powder are mixed. A proportion of the flux contained in the solder paste 21A is, for example, about 5 to 15 wt %.

As the solder powder mixed in the solder paste 21A, both of solder containing lead and lead-free solder can be adopted. As a specific composition of the solder powder, for example, Sn63/Pb37, Sn/Ag3.5, Sn/Ag3.5/Cu0.5, Sn/Ag2.9/Cu0.5, Sn/Ag3.0/Cu0.5, Sn/Bi58, Sn/Cu0.7, Sn/Zn9, Sn/Zn8/Bi3 and the like are conceivable. The numbers described above indicate wt % relative to the entire solder. Considering that lead has a load significantly affecting on the environment, it is preferable to use the lead-free solder. The solder paste 21A containing the lead-free solder tends to have poor solder wettability. However, the surface tension of the flux is reduced by action of the added sulfur. Thus, occurrence of sink is suppressed.

As the flux, rosin-based flux and water-soluble flux are both applicable. However, the water-soluble flux is preferable. This is because the water-soluble flux has strong soldering properties and is suitable for attaching the solder 19A to the entire surface of the pad 18A. When the water-soluble flux is used, by melting of the solder paste 21A, a highly corrosive flux residue is generated. Therefore, in this embodiment, after a reflow step is finished, the residue is cleaned and removed.

The flux used in this embodiment is a RA type having a very strong active force. By using the flux of the RA type, even if an oxide film is formed on the surface of the plated film 20, the oxide film can be removed by the flux. Therefore, in this embodiment, it is not required to cover the surface of the plated film 20 with gold plating or the like in order to prevent formation of the oxide film. Generally, the flux is classified broadly into a R type (Rosin base), a RMA type (Mildly Activated Rosin base) and a RA type (Activated Rosin base) in the order from a weaker active force. In this embodiment, the flux of the RA type having the strongest active force is used.

In this embodiment, before the circuit elements are mounted, the melted solder 19A is previously formed on the large pad 18A. This is because, in this embodiment, mounting of the circuit elements is sequentially performed from a relatively small circuit element such as a small signal transistor. After the circuit element such as the small signal transistor is fixed, it is difficult to print the solder paste on the upper surface of the large pad 18A. Thus, by preparing the solder 19A melted on the pad 18A, the problem described above can be avoided.

Figure 4B:
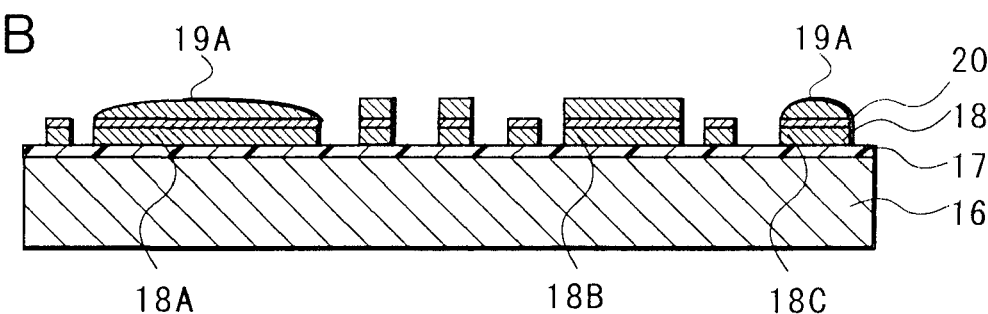
FIG. 4B is a cross-sectional view.
Figure 4C:
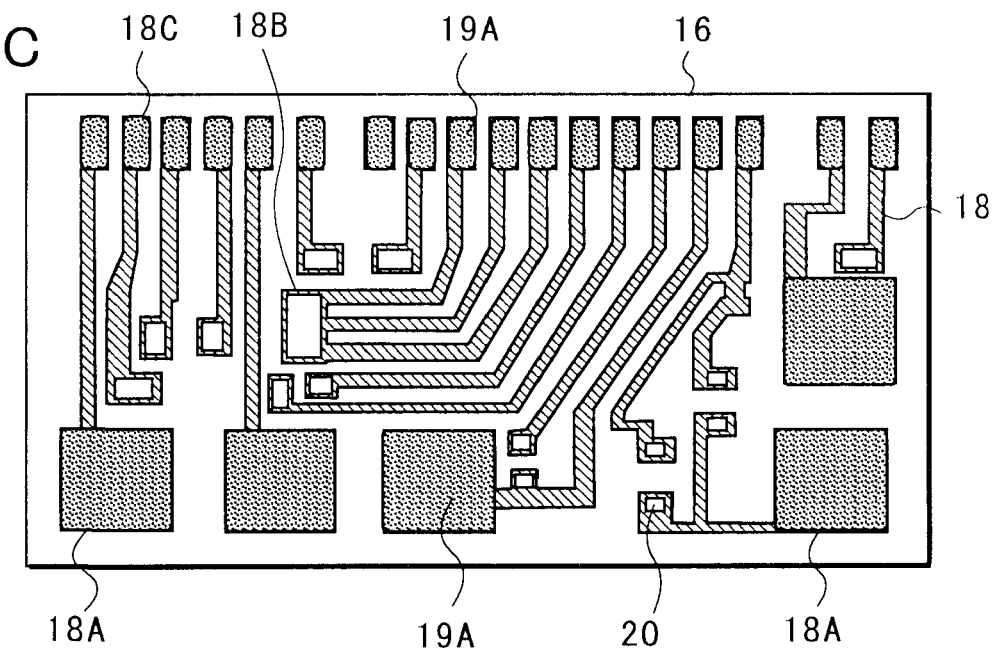
FIG. 4C is a plan view and FIG. 4D is a cross-sectional view which show the method of manufacturing a circuit device of the second embodiment of the present invention.

As shown in FIGS. 4B and 4C, next, the solder paste 21A is melted by the reflow step of performing heating and melting, and the solder 19A is formed on the upper surfaces of the pads 18A and 18C. FIG. 4B is a cross-sectional view of the substrate 16 after the solder 19A is formed, and FIG. 4C is a plan view thereof.

The heating and melting of the solder paste 21A is performed by heating a rear surface of the substrate 16 by use of a heater block and performing infrared irradiation from above. If the solder paste 21A contains tin-lead eutectic solder, a reflow temperature is about 220° C. Moreover, if the solder paste 21A is the lead-free solder (for example, Sn/Ag3.5/Cu0.5), the reflow temperature is about 250° C.

In this embodiment, by allowing the solder paste 21A to contain sulfur in a predetermined proportion, the solder 19A can be formed by heating and melting the solder paste 21A while suppressing sink of the solder. Therefore, as shown in FIG. 4C, the surfaces of the pads 18A and 18C are entirely covered with the solder 19A. Particularly, in the large pad 18A to which the heat sink is fixed, the sink tends to occur. However, the use of the solder paste 21A of this embodiment, which contains sulfur, can eliminate the risk described above.

Figure 4D:
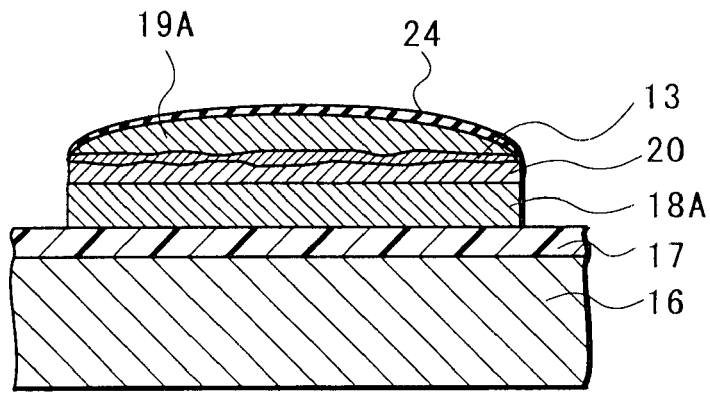

FIG. 4D is an enlarged cross-sectional view of the pad 18A on which the solder 19A is formed. As shown in FIG. 4D, by melting the solder paste 21A containing sulfur, the solder 19A is formed on the entire upper surface of the pad 18A. Therefore, the upper surface of the solder 19A is set to be a smoothly curved surface similar to a flat surface. A flux 24 is generated when the solder paste 21A is melted. Then, the flux 24 is attached to the upper surface of the solder 19A. Accordingly, the amount of the flux flowing out to the surrounding is limited. Thus, it is possible to prevent the surrounding pattern from being corroded by the highly corrosive flux. As described above, the flux used in this embodiment is the RA type having the strongest active force. The flux of the RA type having the strong active force also has a strong oxidizing power. Thus, if the flux leaks out on the surface of the substrate 16, the conductive pattern 18 may be corroded. Therefore, in this embodiment, the upper surface of the solder 19A is set to be a smoothly curved surface, and the flux 24 is attached to the upper surface of the solder 19A. Thus, the flux is prevented from leaking out to the surrounding.

Furthermore, in this embodiment, formation of the plated film 20 made of nickel on the surface of the pad 18A also contributes to prevention of occurrence of the sink. To be more specific, the plated film 20 is formed on the surface of the pad 18A made of copper, and the solder 19A is formed on the surface of the plated film 20. Thus, the solder 19A and the pad 18A can be prevented from coming into direct contact with each other. Therefore, an intermetallic compound made of tin that is a major component of the solder and copper that is a material of the pad is never generated. According to the configuration of this embodiment, an intermetallic compound made of tin that is a major component of the solder and nickel that is a material of the plated film 20 is generated. Specifically, a Ni/Sn alloy layer 13 is formed on an interface between the plated film 20 and the solder 19A. The Ni/Sn alloy layer 13 has solder wettability better than that of a Cu/Sn alloy layer. Therefore, in this embodiment, occurrence of sink caused by poor solder wettability of the intermetallic compound is suppressed.

It is considered that by heating and melting the solder paste 21A, most of sulfur flows out to the outside of the solder 19A together with the flux component. However, there is also a possibility that a very small amount of sulfur remains in the solder 19A and reduces the surface tension of the melted solder 19A in a subsequent step of remelting the solder 19A.

Third Step: See FIGS. 5A to 5C

In this step, a small signal transistor and the like are fixed to the substrate 16.

Figure 5A:
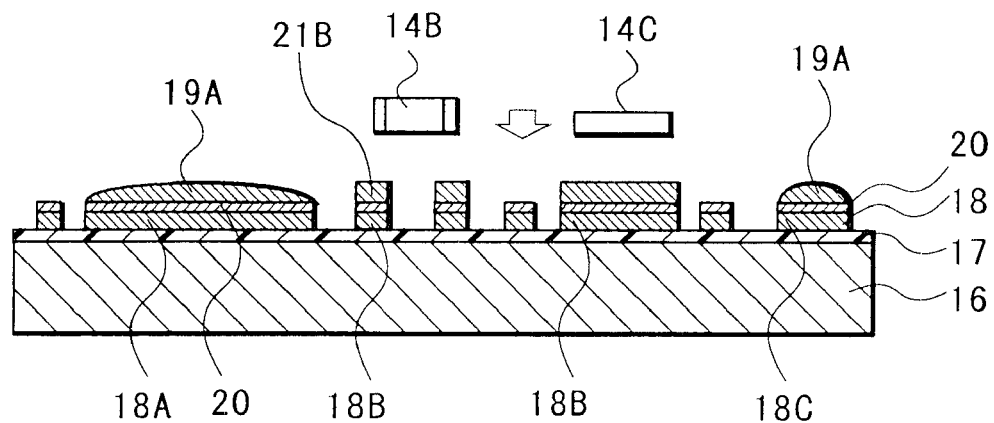
FIGS. 5A and 5B are cross-sectional views and FIG. 5C is a plan view which show the method of manufacturing a circuit device of the second embodiment of the present invention.

As shown in FIG. 5A, first, solder paste 21B is applied to the upper surface of the pad 18B by screen printing. Thereafter, a chip component 14B and a transistor 14C are temporarily mounted on the solder paste 21B. The solder paste 21B used in this step is preferably one containing rosin-based flux. By using the rosin-based flux which is less corrosive than water-soluble flux, it is possible to prevent corrosion of the conductive pattern 18 positioned around the pad 18B. Moreover, as the solder paste 21B, the solder paste containing sulfur, which is used in the preceding step, may be used or solder paste containing no sulfur may be used. The pad 18B is a small pad to which the small signal transistor 14C, the chip component 14B or the like is fixed. Therefore, compared with the large pad 18A, there is less risk that sink of the solder occurs.

Figure 5B:
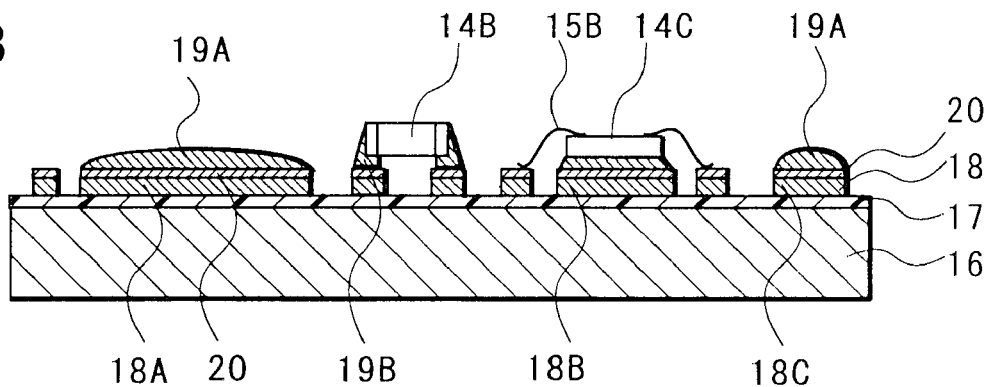

As shown in FIG. 5B, next, by heating and melting the solder paste 21B on which the chip component 14B and the like are mounted, the circuit elements described above are fixed. A reflow temperature in this step is the same as that in the preceding step where the solder 19A is melted. Therefore, by melting the solder paste 21B to form solder 19B, the solder 19A formed on the pad 18A is also remelted.

When the solder 19A attached to the large pad 18A is remelted, there is a high risk that sink occurs. This is because the solder 19A to be remelted contains no flux that improves soldering properties. Furthermore, when a large amount of the solder 19A attached to the large pad 18A is melted, there is action of large surface tension. This large surface tension also causes occurrence of sink.

Accordingly, in this embodiment, the plated film 20 made of nickel is formed on the surface of the pad 18A so that the solder 19A does not come into direct contact with the pad 18A. Thus, occurrence of the sink is suppressed. To be more specific, by forming the plated film 20, tin contained in the solder and copper that is the material of the pad do not come into direct contact with each other. Thus, the Cu/Sn alloy layer formed of the intermetallic compound made of tin and copper is never formed. According to the configuration of this embodiment, the Ni/Sn alloy layer formed on the surface of the plated film has soldering properties better than those of the Cu/Sn alloy layer. Thus, in this step, sink of the solder 19A is suppressed.

After the step described above is finished, the small signal transistor 14C is electrically connected to the conductive pattern 18 through a thin wire 15B. Moreover, the small signal transistor 14C may be fixed by use of conductive paste such as Ag paste.

Figure 5C:
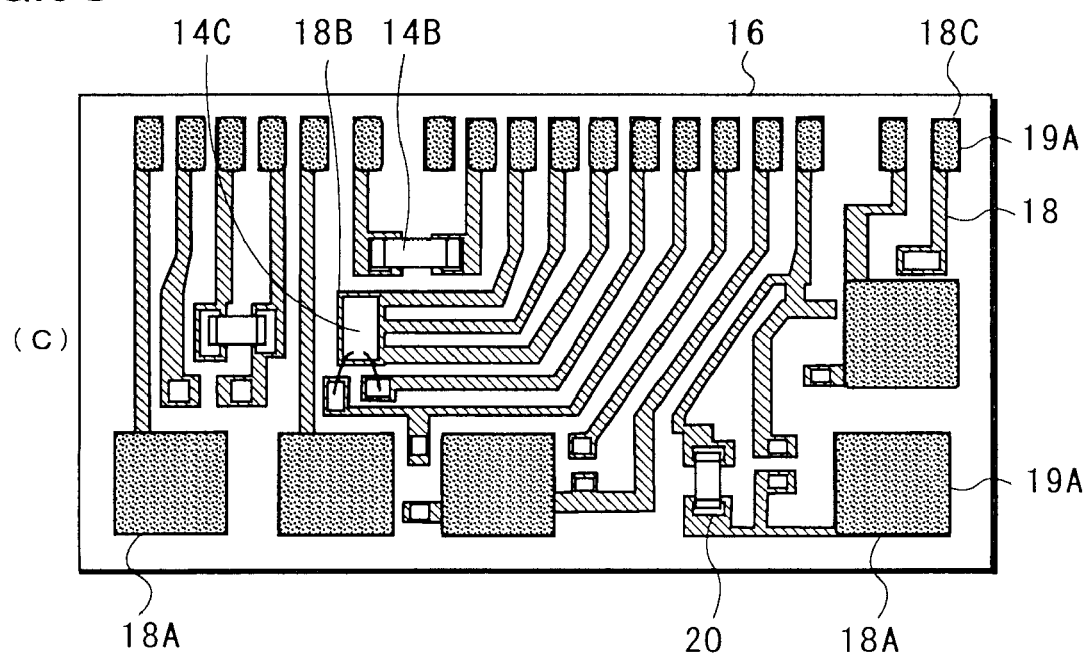

FIG. 5C shows a plan view of the substrate 16 after this step is finished. In the solder 19A formed on the surface of the pad 18A, no sink occurs. Specifically, the entire surface of the pad 18A is covered with the solder 19A.

Figure 6A:
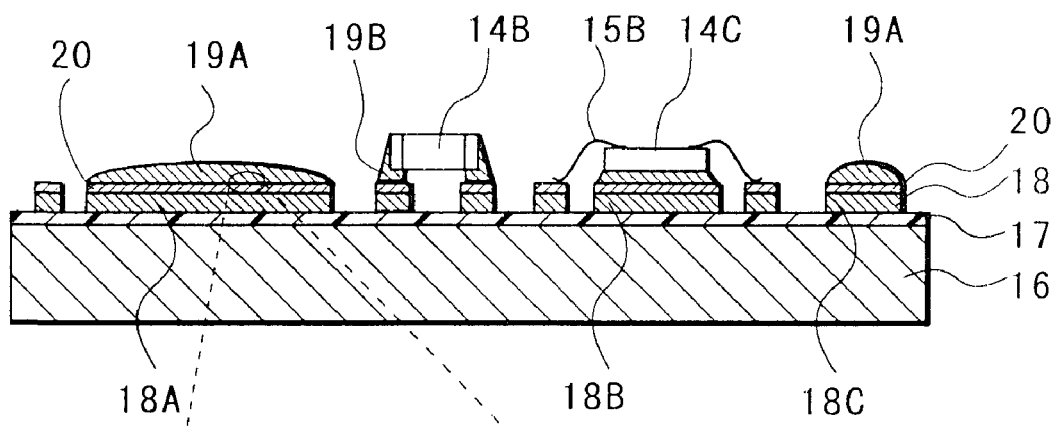
FIG. 6A is a cross-sectional view of a substrate and FIG. 6B is a SEM image which show the method of manufacturing a circuit device of the second embodiment of the present invention.
Figure 6B:
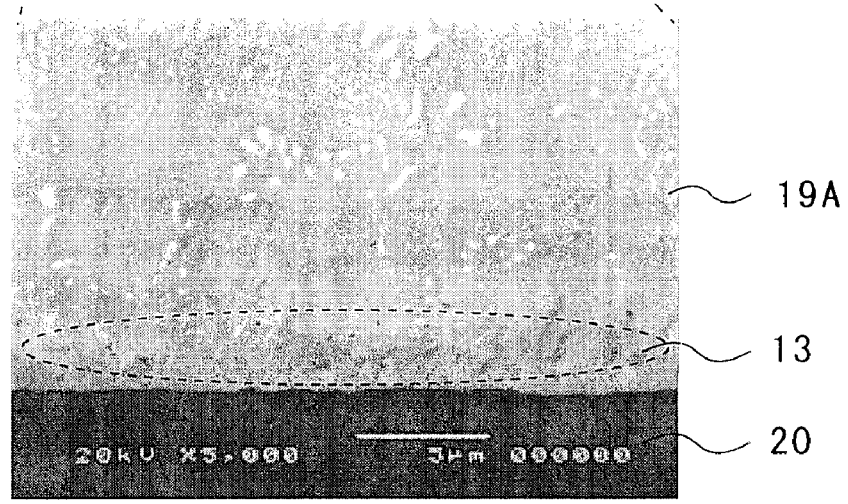

With reference to FIGS. 6A and 6B, detailed description will be given of the boundary between the solder 19A and the plated film 20 after the step described above is finished. FIG. 6A is a cross-sectional view of the substrate 16 after the step described above is finished, and FIG. 6B shows a SEM image of the boundary between the solder 19A and the plated film 20.

As shown in FIG. 6B, an alloy layer 13 having a thickness of about 2 μm is generated on the boundary between the solder 19A and the plated film 20. As described above, the alloy layer 13 is made of tin contained in the solder 19A and nickel that is the material of the plated film 20. A rate at which the alloy layer 13 of this embodiment is generated is much slower than that of the alloy layer containing copper, which has been described in the background.

Moreover, nickel becomes a barrier film of Cu formed therebelow and can suppress deposition of Cu on a surface of Ni. Thus, a reaction of Cu and Sn is suppressed as much as possible, and occurrence of sink is suppressed. Furthermore, a surface of the alloy layer 13 is set to be a rough surface compared with that described in the background. Thus, the surface of the alloy layer 13 is an environment where it is difficult for the liquefied solder 19A to move. This also contributes to prevention of the sink.

Fourth Step: See FIGS. 7A and 7B

In this step, a heat sink 14D is mounted on the pad 18A.

Figure 7A:
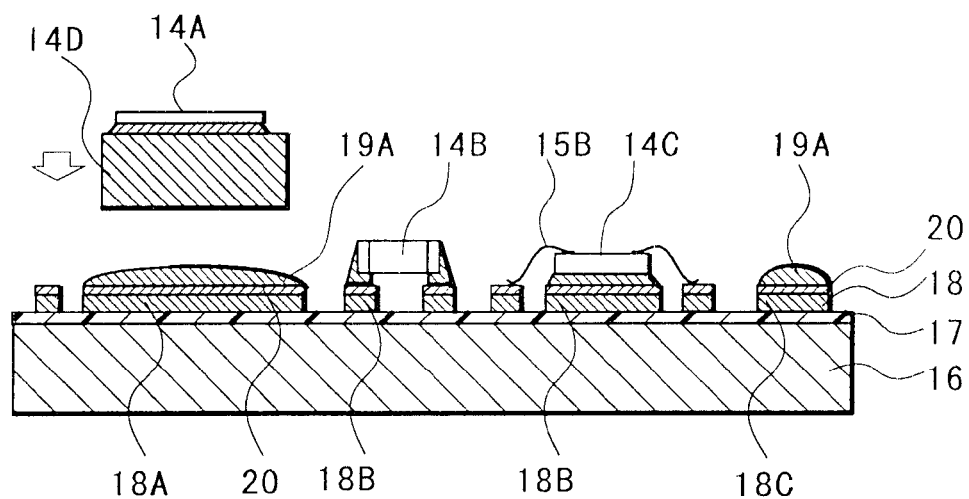
FIGS. 7A and 7B are cross-sectional views showing the method of manufacturing a circuit device of the second embodiment of the present invention.

As shown in FIG. 7A, first, the heat sink 14D having the power transistor 14A fixed thereon is mounted on the solder 19A formed on the pad 18A. Thereafter, by using a hot plate to heat the substrate 16, the solder 19A formed on the pad 18A is remelted. Thus, the heat sink 14D is fixed to the pad 18A. Here, a specific size of the heat sink 14D is about length× breadth×thickness=8 mm×8 mm×2 mm. In this embodiment, instead of the method using the hot plate, the solder may be melted in a reflow step using a reflow furnace.

In this embodiment, since the sink of the solder 19A is suppressed, an entire rear surface of the heat sink 14D is fixed to the pad 18A with the solder 19A interposed therebetween. Therefore, heat release properties of the power transistor 14A mounted on the heat sink 14D are ensured.

Figure 7B:
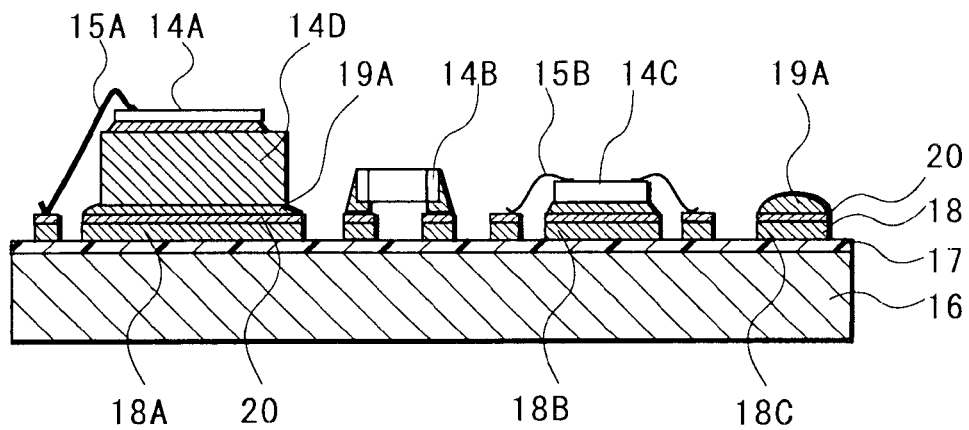

As shown in FIG. 7B, next, an emitter electrode and a base electrode of the power transistor 14A are connected to the predetermined conductive pattern 18 by use of a thick wire 15A having a diameter of about 300 μm.

In this embodiment, after the small signal transistor 14C is fixed and the thin wire 15B is formed, the heat sink 14D is fixed. This is because it is difficult to dispose the transistor 14C and form the thin wire 15B in the vicinity of the heat sink 14D after the heat sink 14D is fixed. By disposing the heat sink 14D that is a large circuit element after a small circuit element is fixed, the small circuit element can be disposed near the heat sink 14D.

Fifth Step: See FIGS. 8A and 8B

In this step, the lead 11 is fixed and a sealing resin 12 is formed.

Figure 8A:
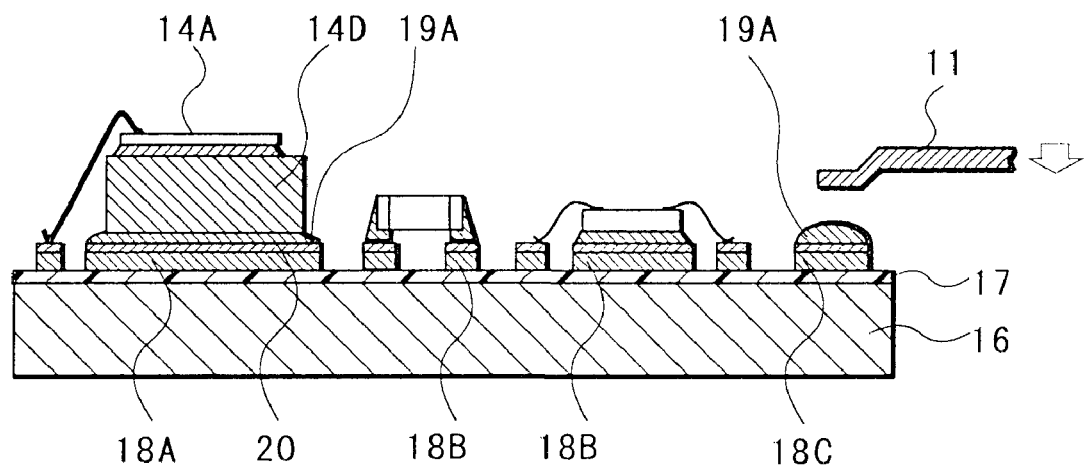
FIGS. 8A and 8B are cross-sectional views showing the method of manufacturing a circuit device of the second embodiment of the present invention.

As shown in FIG. 8A, first, the lead 11 is mounted on the pad 18C. Thereafter, the solder 19A is melted to fix the lead. To be more specific, the solder 19A is melted by irradiation of a light beam while heating the substrate 16 by use of a hot plate. Thus, the lead 11 is fixed.

Figure 8B:
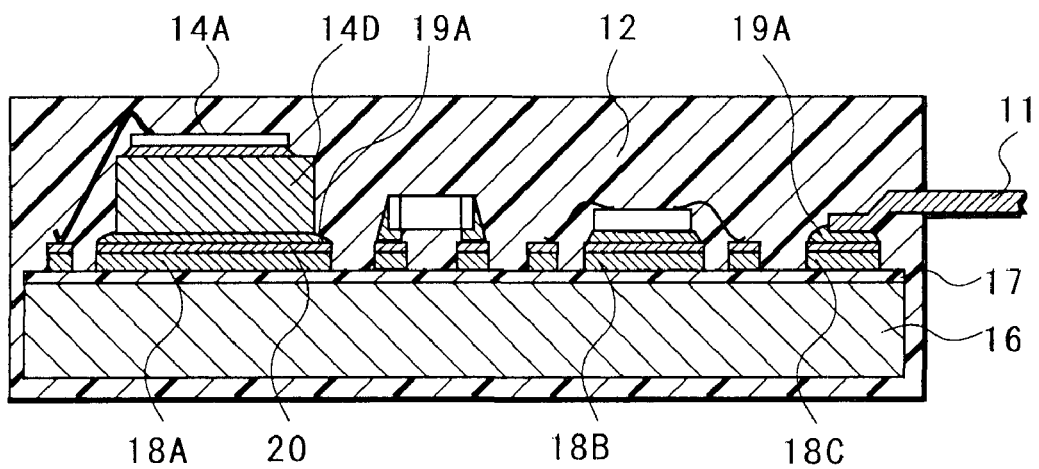

As shown in FIG. 8B, next, the sealing resin 12 is formed by transfer molding so as to cover the circuit elements fixed to the surface of the substrate 16. To be more specific, the sealing resin 12 is formed so as to also cover the sides and rear surface of the substrate 16. Here, the sealing resin 12 can also be formed while exposing the rear surface of the substrate 16 to the outside. Furthermore, the surface of the substrate 16 can also be sealed by use of a case material. By the steps described above, the hybrid integrated circuit device 10 as shown in FIGS. 1A to 1C is formed.

Third Embodiment

In this embodiment, description will be given of another method of manufacturing a hybrid integrated circuit device. Here, solder paste is collectively melted to fix circuit elements.

Figure 9A:
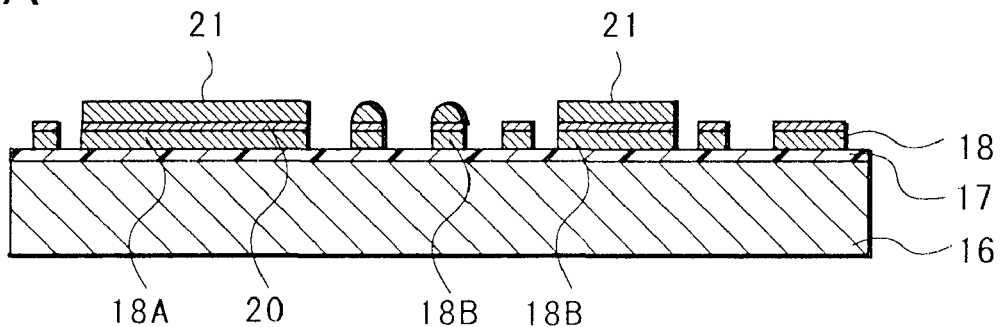
FIGS. 9A to 9D are cross-sectional views showing the method of manufacturing a circuit device of a third embodiment of the present invention.

As shown in FIG. 9A, first, a substrate 16 on which a conductive pattern 18 is formed is prepared, and solder paste 21 is applied to desired pads. In this embodiment, the conductive pattern 18 forms pads 18A and 18B. The pad 18A is a pad to which a heat sink is fixed, and is formed to be as large as about 9 mm×9 mm or more, for example. The pad 18B is a pad to which a chip component such as a chip resistor or a small signal transistor is fixed, and is formed to be smaller than the pad 18A.

In this embodiment, a plated film 20 made of nickel is formed on a surface of the large pad 18A in which sink is likely to occur. Therefore, even if the solder paste 21 is melted, a Cu/Sn alloy layer having poor soldering properties is not formed. In this embodiment, a Ni/Sn alloy layer having soldering properties better than those of the Cu/Sn alloy layer is formed on a surface of the plated film 20.

Furthermore, as the solder paste 21 used in this step, flux having sulfur mixed therein can be used as in the case of the second embodiment. Sulfur is mixed in a proportion of 20 to 80 PPM into the flux. By adding sulfur, surface tension of the melted solder paste 21 is reduced.

Figure 9B:
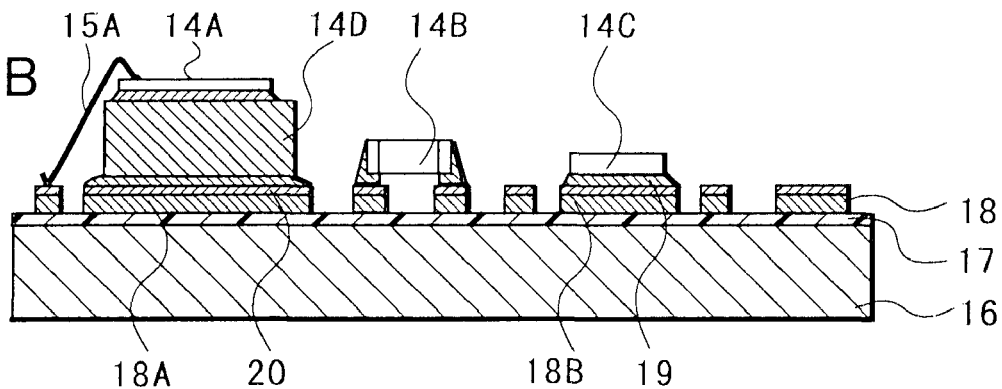

As shown in FIG. 9B, next, after a circuit element such as a heat sink 14D is temporarily attached to the solder paste 21, reflow is performed to fix the circuit element. To be more specific, the heat sink 14D having a power transistor 14A mounted thereon is temporarily attached to the pad 18A by use of a chip mounter. Thereafter, a chip component 14B and a small signal transistor 14C are temporarily attached to the small pad 18B. Furthermore, after temporary attachment of the circuit elements described above is all finished, heating and melting are performed to melt the solder paste. Thus, the circuit elements are fixed by use of a solder 19. In this step, by using the solder paste containing sulfur, sink of the solder is suppressed. Furthermore, in this step, the elements fixed by use of the solder are collectively reflowed. Thus, there is an advantage that the manufacturing steps can be shortened. Moreover, after the reflow of the solder is finished, a small signal transistor may be fixed by use of conductive paste such as Ag paste.

As described above, in this embodiment, the upper surfaces of the pad 18A and the like are covered with the plated film 20. Therefore, when the solder paste 21 applied to the pad 18A is melted, the Ni/Sn alloy layer having excellent soldering properties is formed on the surface of the plated film 20. Thus, the sink of the solder 19 is suppressed.

Figure 9C:
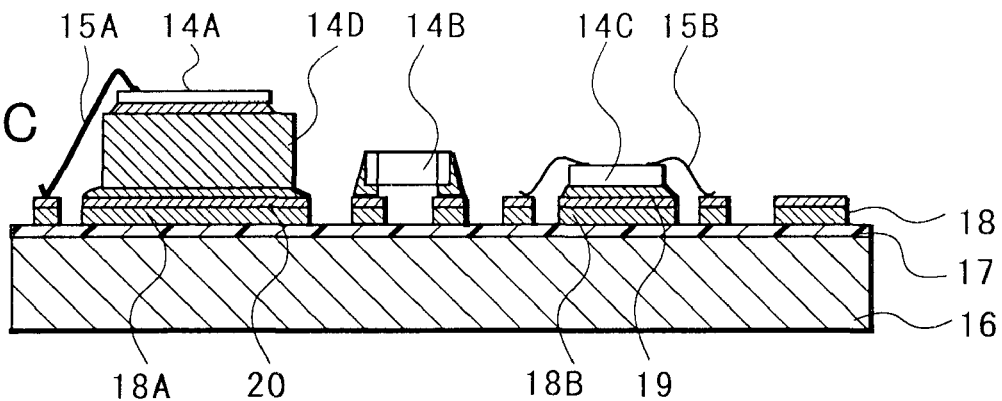

As shown in FIG. 9C, next, the desired conductive pattern 18 and the circuit elements are connected to each other through thin metal wires. To be more specific, electrodes of the small signal transistor 14C are connected to the desired conductive pattern 18 by use of thin wires 15B made of aluminum wires having a diameter of about 80 μm. Moreover, an electrode of the power transistor 14A is connected to the desired conductive pattern 18 by use of a thick wire 15A made of an aluminum wire having a diameter of about 300 μm.

Figure 9D:
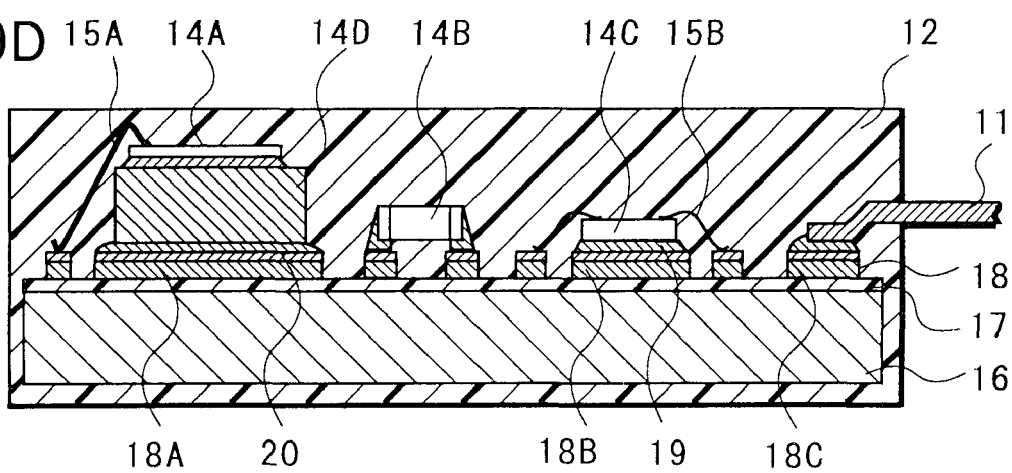
Figure 11A:
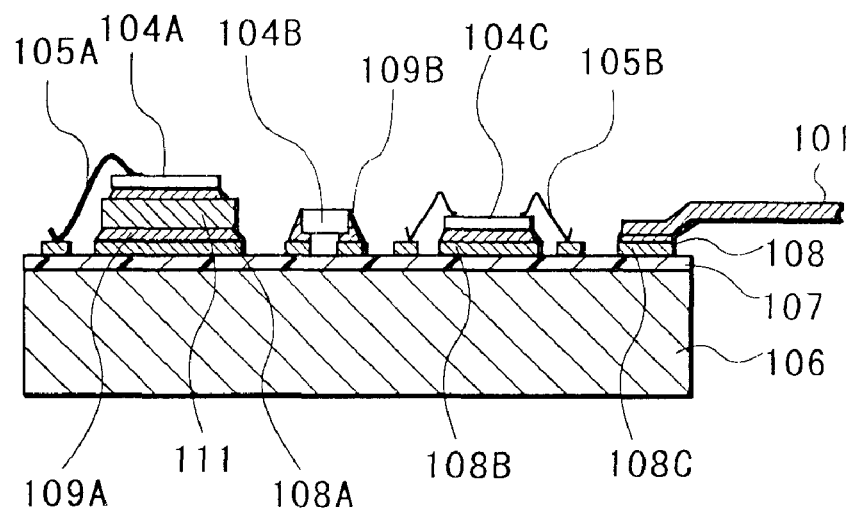
FIGS. 11A and 11B are cross-sectional views showing the conventional method of manufacturing a circuit device.
Figure 11B:
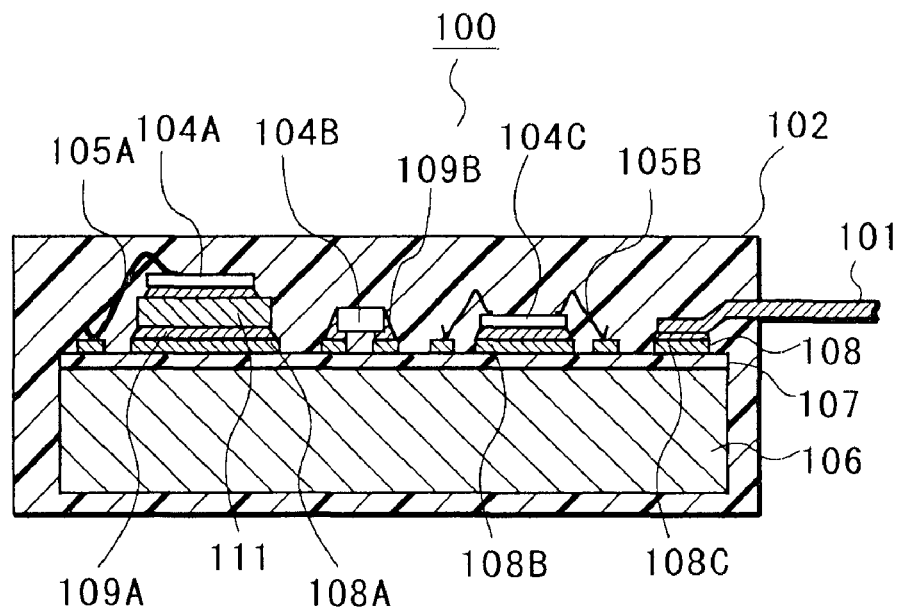
Figure 12A:
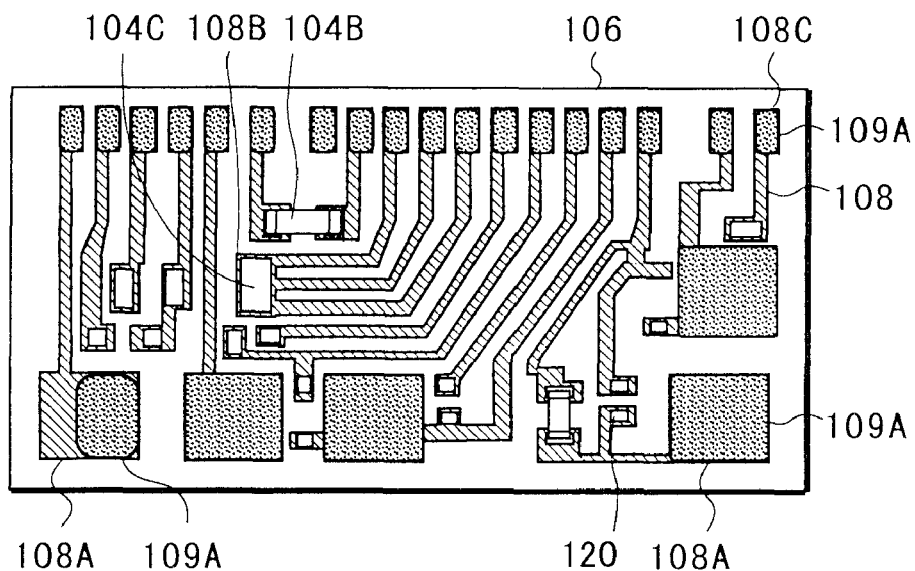
FIG. 12A is a plan view.
Figure 12B:
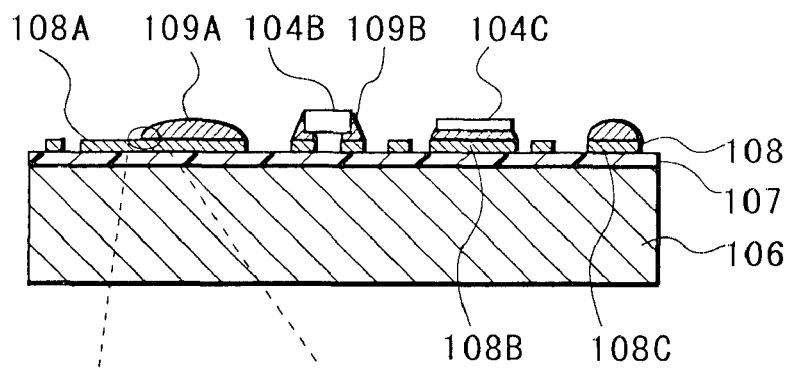
FIG. 12B is a cross-sectional view and FIG. 12C is an enlarged cross-sectional view which show the conventional method of manufacturing a circuit device.
Figure 12C:
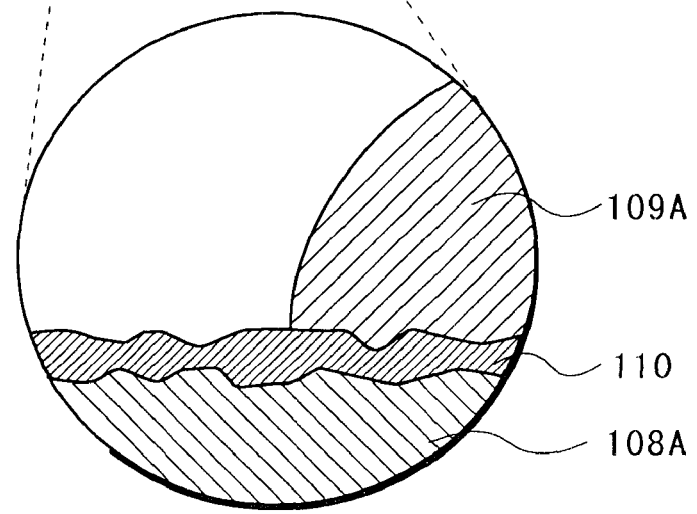
Figure 13A:
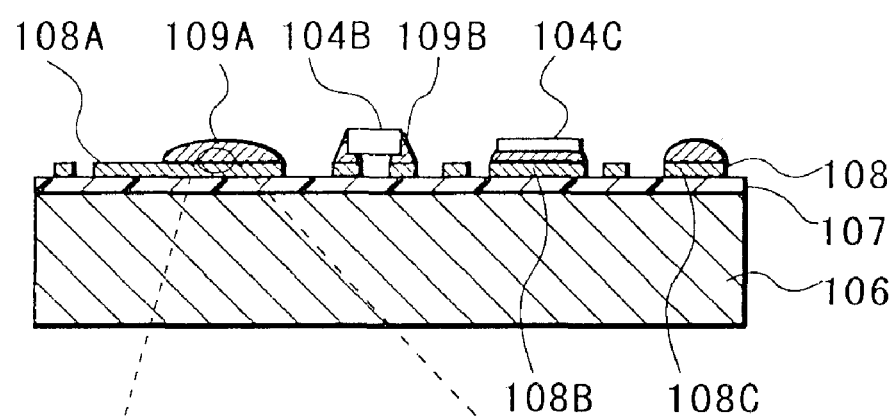
FIG. 13A is a cross-sectional view of a substrate and FIG. 13B is a SEM image which show the conventional method of manufacturing a circuit device.
Figure 13B:
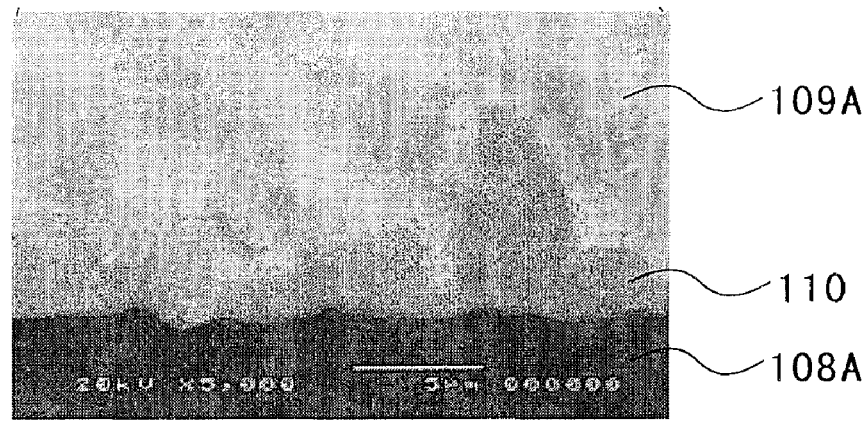

As shown in FIG. 9D, next, a lead 11 is fixed to a pad 18C provided in a peripheral part of the substrate 16. Thereafter, a sealing resin 12 is formed so as to cover at least the surface of the substrate 16. By the steps described above, a hybrid integrated circuit device is manufactured.

In this embodiment, the circuit elements fixed by use of the solder paste are collectively reflowed. Thus, it is possible to provide a manufacturing method including reduced steps.

According to the circuit device of the embodiments of the present invention and the manufacturing method thereof, it is possible to suppress occurrence of sink in the solder attached to the surface of the pad by forming the plated film on the surface of the pad on which the circuit element is mounted. To be more specific, the solder is attached to the surface of the plated film formed so as to cover the pad, and the circuit element such as a heat sink is fixed by use of the solder. Therefore, since the solder does not come into direct contact with the pad, an ally layer formed of an intermetallic compound made of tin contained in the solder and copper that is a material of the pad is not formed. Since the intermetallic compound made of copper and tin has poor soldering properties, solder wettability for the pad can be improved by preventing generation of the intermetallic compound.

In the conventional case, particularly, when the lead-free solder is used, there occurs a problem of sink of solder due to the intermetallic compound made of copper and tin. According to the configuration of the embodiments of the present invention, the compound itself is not formed. Therefore, even if the lead-free solder having poor wettability is attached to a relatively large pad, occurrence of sink in the solder can be suppressed.

What is claimed is:

1. A method of manufacturing a circuit device, comprising:

forming a conductive pattern on a surface of a substrate, the conductive pattern including a first pad covered with a plated film and a second pad smaller than the first pad, wherein the substrate is comprised of metal and an upper surface of the metal substrate is covered by a insulating layer and the conductive pattern is formed on the insulating layer, and wherein the plated film is comprised of nickel and the conductive pattern is comprised of Cu;

applying solder paste, said solder paste comprising a mixture of flux and solder powder, to the plated film formed on the surface of the first pad directly and heating and melting the solder paste to form solder directly on a nickel-comprising surface of the plated film in such a manner that at the start of the step of applying solder paste there is no intermediate layer between the solder paste and the nickel-comprising surface of the plated film, wherein an alloy layer of an intermetallic compound that includes Ni and Sn is formed on a boundary between the solder and the plated film, and wherein said solder paste is Pb-free and contains Sn, Ag and Cu;

fixing a small signal transistor or a chip component to the second pad;

fixing a heat sink on which a power transistor is mounted to the first pad by remelting the solder formed on the plated film which covers the surface of the first pad;

wherein said solder paste includes sulfur that is provided in a proportion of 20 to 80 PPM within said flux, and wherein said solder paste is made by first dissolving a granular sulfur in a solvent, then after the solvent containing sulfur and flux are mixed, the flux and solder powder are mixed, and wherein a proportion of the flux contained in the solder paste is about 5 to 15 wt %.

2. The method of manufacturing a circuit device according to claim 1, wherein the solder is melted more than once.

3. The method of manufacturing a circuit device according to claim 1, wherein the plated film is formed by use of an electroplating method.

4. The method of manufacturing a circuit device according to claim 1, wherein the plated film is made of nickel, and an alloy layer made of the solder and the nickel is formed on an interface between the plated film and the solder.

5. The method of manufacturing a circuit device according to claim 4, wherein a surface of the alloy layer is a rough surface.

6. The method of manufacturing a circuit device according to claim 1, wherein the first pad has a size of about 9 mm by 9 mm, or greater.

7. The method of manufacturing a circuit device according to claim 1, wherein the solder paste contains sulfur.

8. The method of manufacturing a circuit device according to claim 1, further comprising removing an oxide film covering a surface of the first pad by a flux in the solder paste.

9. The method of claim 1, wherein said step of applying solder paste includes applying solder paste directly to a nickel containing surface of the plated film.

10. The method of claim 9, wherein said step of applying solder paste directly to a nickel containing surface of the plated film includes directly contacting the solder paste to nickel of said nickel containing surface.

* * * * *